United States Patent [19]

Streckenbach

[11] 4,002,984
[45] Jan. 11, 1977

[54] CIRCUIT ARRANGEMENT FOR DETERMINING THE TIME DURATION OF RECEIVED OSCILLATIONS

[75] Inventor: Wülf-Christian Streckenbach, Hemmingen, Germany

[73] Assignee: Licentia Patent-Verwaltungs-G.m.b.H., Frankfurt, Germany

[22] Filed: Nov. 26, 1975

[21] Appl. No.: 636,223

[30] Foreign Application Priority Data

Nov. 27, 1974 Germany .......................... 2456005

[52] U.S. Cl. .......................... 325/392; 340/171 PF; 343/228; 328/140
[51] Int. Cl.² .......................................... H04B 1/06
[58] Field of Search ............. 325/37, 325, 390–392; 178/DIG. 15; 340/147 F, 148, 164, 167 R, 168 R, 171 R, 171 PF; 343/225, 228; 328/48, 140, 37; 307/233 R

[56] References Cited

UNITED STATES PATENTS

| 3,651,469 | 3/1972 | Keese | 340/168 R |
|---|---|---|---|
| 3,798,601 | 3/1974 | Hulsbosch et al. | 340/171 PF |
| 3,855,575 | 12/1974 | Leuschner et al. | 340/171 R |
| 3,900,880 | 8/1975 | Fleischer et al. | 343/225 |
| 3,914,698 | 10/1975 | Leuschner | 325/390 |
| 3,953,832 | 4/1976 | Streckenbach | 340/171 R |

Primary Examiner—Robert L. Griffin
Assistant Examiner—Jin F. Ng
Attorney, Agent, or Firm—Spencer & Kaye

[57] ABSTRACT

A circuit arrangement for evaluating received oscillations whose maximum possible time duration is predetermined, by determining the time duration of the oscillations. Pulses of a constant frequency are fed to a counter during the time the oscillations are being received and a count representative of the number of counted pulses is stored in a memory as information. Whenever the counter state representing the maximum possible time duration has been exceeded, indicating that the received oscillations are interfering oscillations or noise, the feeding of pulses to the counter is interrupted and the stored information is erased.

10 Claims, 2 Drawing Figures

CICUIT ARRANGEMENT FOR DETERMINING THE TIME DURATION OF RECEIVED OSCILLATIONS

BACKGROUND OF THE INVENTION

The present invention relates to a circuit arrangement for evaluating received oscillations whose maximum possible time duration is predetermined, by determining the time duration of the oscillations by means of a counter which receives pulses during the occurrence of the oscillation and by storing the counted pulses as information. More particularly the present invention relates to such a circuit arrangement for ultrasonic remote control of a television receiver.

For remote control of an instrument there exists the requirement of substantially eliminating interfering influences caused by noise or permanent interference sources which have a frequency identical to the useful frequency of the transmitted signal. In an ultrasonic remote control device for television receivers described in the periodical "Funkschau" 1973, Issue No. 18, pages 675–677, a desired operating function is produced in that two ultrasonic signals of different frequencies are transmitted in succession by an ultrasonic signal generator and are received by an ultrasonic signal receiver. The two immediately successive frequencies are coded in their value and in their respective duration. The frequency of the first ultrasonic signal determines whether a channel is to be selected or a level is to be changed, while the duration of this signal component determines the number of the channel or the type and direction of change in level, respectively. The actuation of the performance of the previously stored instruction takes place only after receipt of the second ultrasonic signal at the other frequency. Thus the above-mentioned requirement is met in part in this known ultrasonic remote control device. If an interference signal appears which has a frequency equal to that of the first ultrasonic signal, this signal is received in the same manner as a useful and the corresponding information is stored, but an error in control can occur only if following the above-mentioned interference signal a second interference signal with the frequency of the second ultrasonic signal appears which actuates the performance of the previously stored instruction.

SUMMARY OF THE INVENTION

It is the object of the present invention to further reduce the influence of short-term or continuous interference oscillations in a circuit arrangement for evaluating received oscillations, whose maximum possible time duration of the oscillations is predetermined, by a determination of the time duration of the oscillations.

This is accomplished according to the invention in that the circuit arrangement includes a counter, means for feeding pulses of a constant frequency to the counter during the time period the oscillations to be evaluated are being received, a memory connected to an output of the counter for storing a count representative of the counted pulses as information, and means, connected to the counter and responsive to the counting state thereof, for interrupting the feeding of pulses to the counter and for erasing the stored information in the memory whenever a counter state corresponding to the maximum permissible time duration is exceeded, indicating that the signal being received is an interference or noise signal.

Interrupting the feeding of pulses to the counter and erasing the information as provided by the invention also has the result that in the case where interference oscillations are received which have a frequency which would actuate the performance of a previously stored instruction, no error in control can occur.

DETAILED DESCRIPTION OF THE PREFERRED EMBODIMENTS

Figure 1:
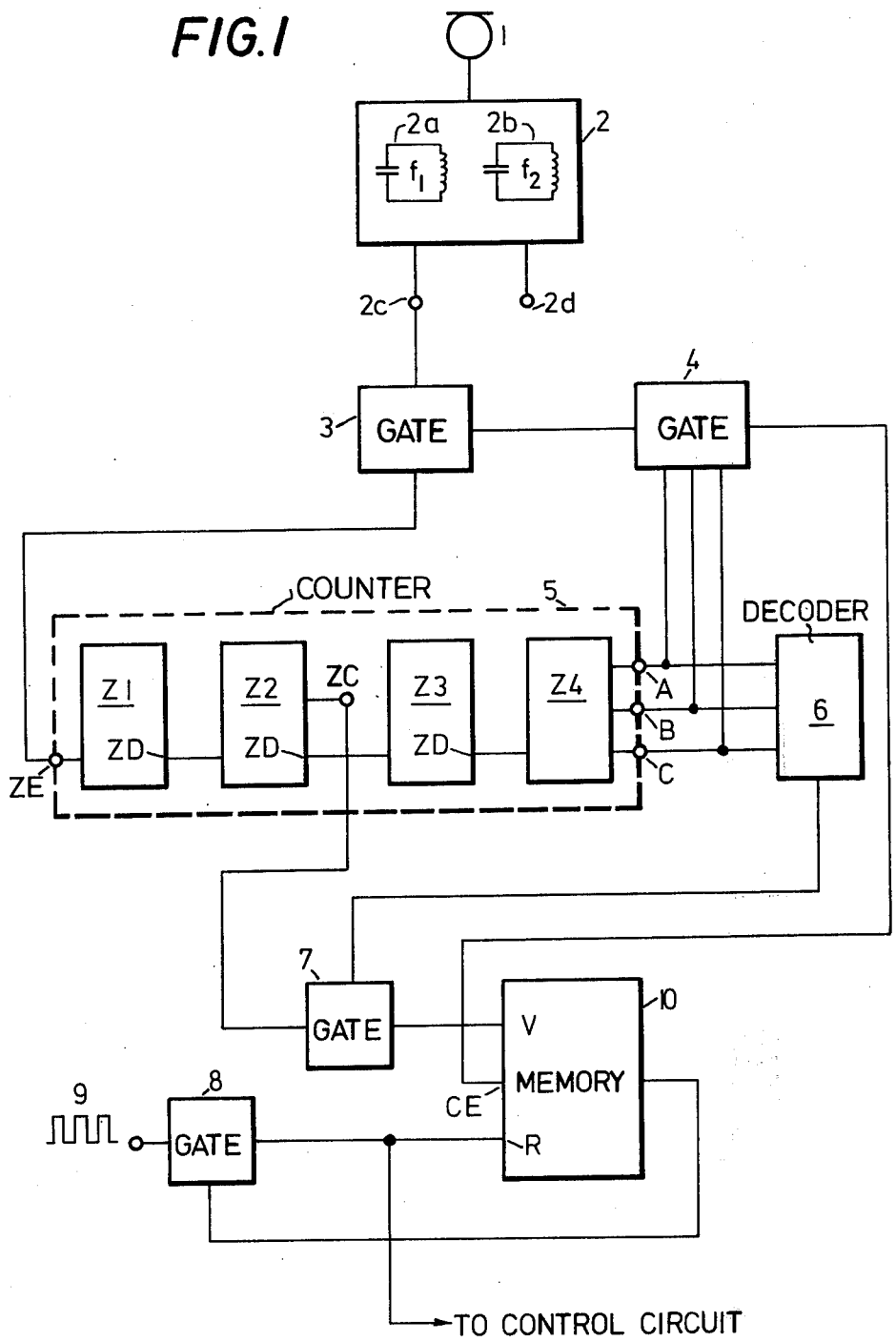
FIG. 1 is a block circuit diagram of the basic circuit according to the invention.

In FIG. 1, the signals or oscillations received by an ultrasonic transducer 1 are fed to a circuit portion 2 which is known, for example, from the ultrasonic remote control device "Supersonic 200°" made by AEG-Telefunken, Germany and which includes, inter alia, two resonant circuits 2a and 2b which are tuned to the frequencies $f_1$ and $f_2$ respectively. In the complete control system, $f_1$ is the frequency of the first ultrasonic signal whose time duration constitutes the information or instruction to be carried out and $f_2$ is the frequency of the second ultrasonic signal which actuates the control system. Circuit component 2 is provided with two output terminals 2c and 2d and tends to separate the two received frequencies and thus provide squarewave oscillations at frequency $f_1$ at output terminal 2c and squarewave oscillations at frequency $f_2$ at output terminal 2d. The oscillations at frequency $f_1$ of the first ultrasonic signal travel through a gate 3 to the counting input ZE of a counter 5. The gate 3, which will be explained in detail below, permits the oscillations at frequency $f_1$ to pass only as long as no oscillations at the other frequency $f_2$ are being received.

Counter 5 is formed of a counter chain including counter stages Z1, Z2, Z3 and Z4, with the counter output ZD, which corresponds to the highest value bit position, of each counter stage being connected to the counting input of the next following counter stage. In order to provide storage for the information associated to the counter state, a memory 10 is provided whose counting input V receives pulses via a gate 7 from one counting output ZC of counter stage Z2. Memory 10, for example, is a forward-backward counter having a forward counting input V and a backward counting input R. The counter outputs A, B and C of the last counter stage Z4 of counter 5 are connected with a decoder 6 which for reasons which will become clear below enables gate 7 only after a certain selectable counter state has been reached.

The evaluation of the information stored in memory 10 is effected in FIG. 1 in that upon the receipt of oscillations at frequency $f_2$ gate 7 is blocked and pulses 9 are conducted through a gate 8 to the backward counting input R of forward-backward counter 10 and the counter content of forward-backward counter 10 is counted back to zero. Gate 8 is blocked in a manner to be explained below once the forward-backward counter 10 has been counted down to zero. This means that only so many pulses can reach the control circuit as had previously been stored in forward-backward counter 10. The backward counting input R is also connected with a control circuit (not shown) for evaluating the information, for example, the control circuit known from the ultrasonic remote control device "Supersonic 200" made by AEG-Telefunken.

Such control device is described in "Funkschau" 1973, page 920 FIG. 4 and page 922, left column. IC's shown in FIG. 4 on page 920 are described in "Funkschau" 1972 page 262.

If interfering pulses at frequency $f_1$ are received by the ultrasonic transducer 1 in the above-described circuit, they are initially counted and stored in the manner described above. Once, however, a given counter state of counter 5 has been reached, gate 3 is blocked by the previously unmentioned gate 4 so that pulses can no longer reach the counting input ZE of counter 5. Moreover, the gate 4 whose inputs are connected to the counting outputs A, B, C of counter stage Z4 effects erasure of the information stored in memory 10 up to the time the predetermined counter state was reached. This prevents errors based on possibly received oscillations at frequency $f_2$.

FIG. 1 is based on a system for an ultrasonic remote control of television receivers as described in detail in copending U.S. Patent application Ser. No. 588,177, filed June 18th, 1975, now U.S. Pat. No. 3,973,241 the subject matter of which is incorporated by reference, in which the first ultrasonic signal at frequency $f_1$ is divided into time regions. Each one of the possible time regions has associated to it a certain type of information. For example, the channel selection function is associated to a one time region and analog functions for changing a level are associated to another time region. The number of the channel to be selected or the type and direction of the change in level, respectively, is determined by where, within the respective time region, the end of the time period of the oscillations at frequency $f_1$ lies.

The above-mentioned division into time regions is effected by evaluation of the counter state of the last counter stage Z4. This counter stage is, for example, a 3-bit binary counter operating in binary code. Counter stage Z1 may be a 4-bit binary counter whose counting capability is sixteen. Counter stages Z2 and Z3 are, for example 4-bit decimal counters operating in the BCD code whose maximum counting capability is ten. Thus after every sixteen pulses at input ZE of counter stage Z1 a counting pulse is fed to the counting input of counter stage Z2, while a counting pulse reaches counter stage Z3 after every one hundred sixty pulses at the counting input ZE of counter stage Z1. The logic states at the counter outputs A, B, C, of counter Z4 effect division of the received oscillations at frequency $f_1$ into time regions as follows: after one thousand six hundred (16 × 10 × 10) oscillations at frequency $f_1$ have been counted, the last counter stage Z4 receives a counting pulse and takes on the counter state "one". At the outputs A, B, C, of stage Z4 there then appear logic states "1", "0", "0" respectively which identify time region I. Only after a further one thousand six hundred oscillations, i.e., after a total of three thousand two hundred oscillations will a further counting pulse reach counter stage Z4. The logic states at outputs A, B, C are then "0", "1", "0" respectively. This identifies the beginning of time region II. FIG. 1 shows as an example time region III, which begins after 4800 oscillations (the logic states at the counter outputs A, B, C of counter stage Z4 are then "1", "1", "0"), and to which is assigned the channel selection functions. The circuit thus recognizes the oscillations fed to counting input ZE upon completion of the number of 4800 oscillations identifying time region III as belonging to the category "channel selection function". In the present case, once 4800 oscillations have been counted, decoder 6 recognizes the beginning of time region III and enables gate 7. Now pulses constituting the information as to which particular channel is to be selected can travel from the counting output ZC of counter stage Z2 into memory 10. A logic "1" is present at the above-mentioned counter output ZC of counter stage Z2 whenever the counter state of counter stage Z2 is four, five, six or seven, and a logic "0" is present at output ZC for the other possible counter states so that after every 160 oscillations at the input ZE the counter output ZC is passed and emits a pulse. The number of these pulses determines which channel is to be switched on. Thus, once a time region, and thus the type of transmitted information, has been determined by the outputs A, B, C of counter stage Z4, the time duration of the transmitted signals at frequency $f_1$, i.e., the particular information within the time region, is determined by the pulses obtained from counting output ZC of counter stage Z2. This particular information depends on at which point, i.e., after how many oscillations within a time region, the time duration of the signal at frequency $f_1$ ends.

Figure 2:
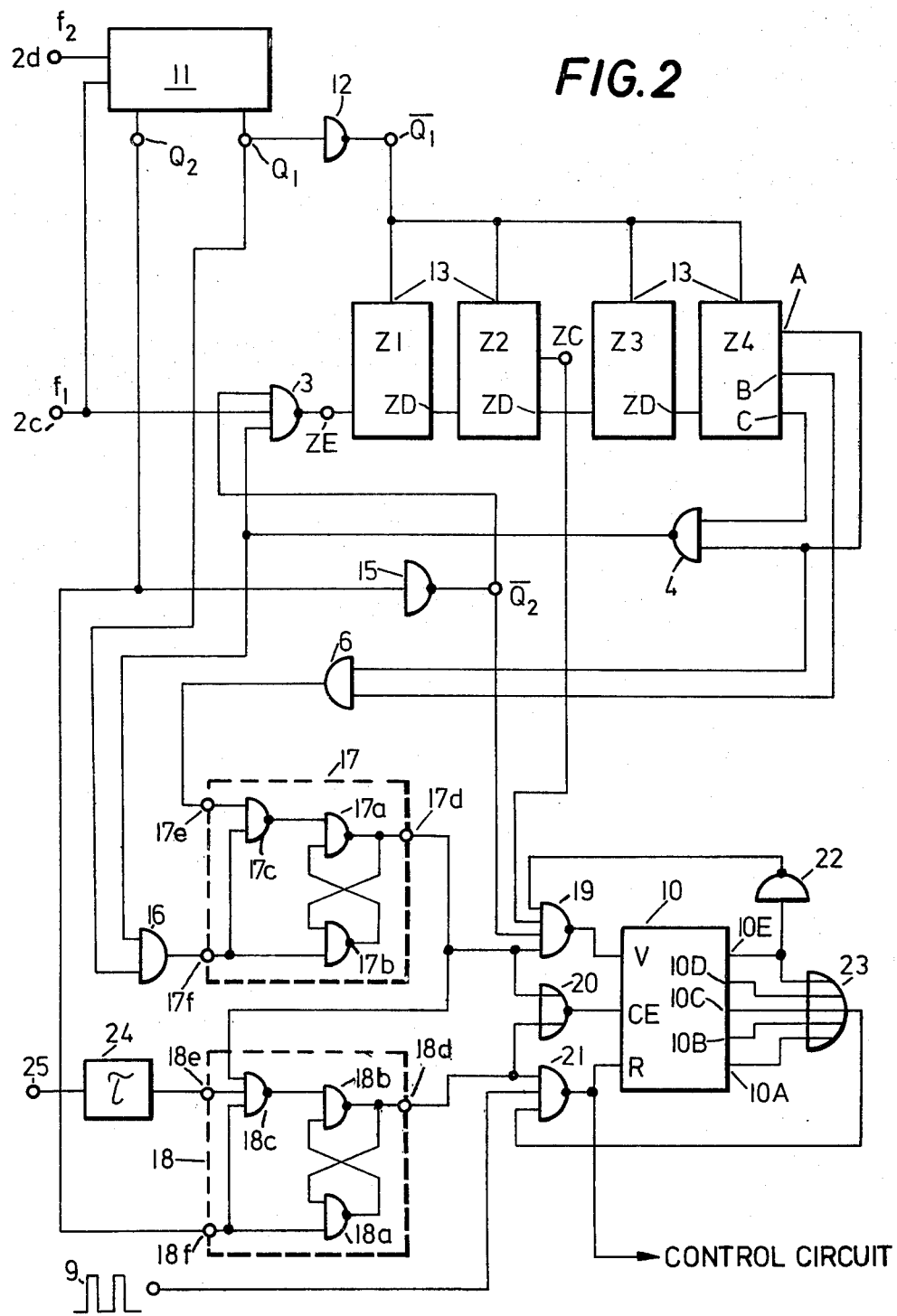
FIG. 2 is a logic circuit diagram of a preferred embodiment of a circuit according to the invention.

FIG. 2 shows an embodiment of a circuit according to the invention as shown in FIG. 1 for an ultrasonic remote control device. Corresponding parts are identified by the same reference numerals. The oscillations at frequency $f_1$ present at terminal 2c or the oscillations at frequency $f_2$ present at terminal 2d are fed to an auxiliary circuit 11 which has two output terminals $Q_1$ and $Q_2$. The auxiliary circuit 11 has the effect that with the beginning of the oscillations at frequency $f_1$ the logic signals $Q_1 = "1"$ and $Q_2 = "0"$ appear at output terminals $Q_1$ and $Q_2$. Upon the occurrence of frequency $f_2$ the potential at output terminal $Q_2$ changes at once from "0" to "1" while the potential at output terminal $Q_1$ changes from "1" to "0" only after a certain delay. The inverse logic states appear at terminals $\overline{Q_1}$ and $\overline{Q_2}$ which are connected with terminals $Q_1$ and $Q_2$ via inverters 12 and 15 respectively. Upon the occurrence of the received oscillation at frequency $f_1$, counter stages Z1, Z2, Z3 and Z4 are set to counter state "zero" so that they are now ready to count due to the logic "0" at terminal $\overline{Q_1}$ which is connected to the reset input 13 of each of the counter stages.

In addition to the basic blocks shown in FIG. 1, the circuit of FIG. 2 includes two flip-flops 17, 18, each having an enabling input 17f or 18f, a setting input 17e or 18e and an output 17d or 18d respectively. Flip-flops 17, 18 are each formed by two crosswise coupled NAND gates 17a, 17b and 18a, 18b which are each controlled by a NAND gate 17c and 18c. The setting input 17e of flip-flop 17 is connected to the output of decoder 6 which in the illustrated embodiment is realized by an AND gate having its two inputs connected to the outputs B and C of counter stage Z4; while the setting input of flip-flop 18 is connected, for reasons to be explained below, to a terminal 25 via a delay member 24. The enabling input 17f of flip-flop 17 is connected to the output of an AND gate 16 whose two inputs are connected to the output of the gate 4 and to terminal $Q_1$, while the enabling input of flip-flop 18 is connected to terminal $Q_2$. The output 17d of flip-flop 17 is connected to one input of the NAND gate 18c of flip-flop 18, to one input of a NAND gate 19 (which essentially corresponds in function to gate 7 of FIG. 1)

and to one input of an OR gate 20 whose output is connected to the so-called clear input CE of the memory or forward-backward counter 10. The output 18d of flip-flop 18 is in turn connected to an input of the OR gate 20 and to one input of a NAND gate 21, which essentially corresponds in function to the gate 8 of FIG. 1 and has its output connected to the backward counting input R of the memory or forward-backward counter 10.

The NAND gate 19, whose output is connected to the forward counting input V of counter 10, additionally has a second input connected to the terminal $\overline{Q_2}$, a third input connected to the output ZC of counter stage Z2 and a fourth input connected to the output of an inverter 22 whose input is connected to the output 10E (which corresponds to the highest value binary bit position) of forward-backward counter 10, which, for example, is a five-bit binary counter. The five outputs 10A, 10B, 10C, 10D and 10E of counter 10 are connected to the respective inputs of an OR gate 23 whose output is connected to a second input of NAND gate 21. The pulses 9 are fed to a further input of NAND gate 21.

Gate 3 which has already been mentioned in connection with FIG. 1 is formed in FIG. 2 by a NAND gate having three inputs. The first input is connected with terminal 2c to receive the squarewave oscillations or pulses of frequency $f_1$, the second input is connected to the terminal $\overline{Q_2}$ and the third input connected with the output of gate 4 which is formed by a NAND gate 4 in FIG. 1. The two inputs of NAND gate 4 are connected to the outputs A and C of counter stage Z4.

In operation of the circuit of FIG. 2, with the beginning of the occurrence of oscillations or pulses at frequency $f_1$ at terminal 2c, $Q_1$ is equal to "1" and $Q_2$ is equal to "0". The oscillations at frequency $f_1$ thus reach the counting input ZE of counter stage Z1 via NAND gate 3. When counter stages Z1, Z2, Z3 and Z4 have counted 4800 oscillations (the logic states at outputs A, B, C of counter stage Z4 are then A = "1", B = "1" and C = "0"), flip-flop 17 is set by a logic "1" at its setting input 17e via AND gate 6 which corresponds to decoder 6 of FIG. 1. Flip-flip 17 can be set because a logic "1" is present at its enabling input 17f via AND gate 16 at the beginning of the signal at frequency $f_1$ by $Q_1$ = "1". NAND gate 17a now changes from a "0" to a "1" signal. Due to the logic "1" at output 17d of flip-flop 17, the forward-backward counter 10 is released by NOR gate 20. The forward-backward counter 10 is ready to count only if a logic "0" is present at its clear input CE. It is now possible for counting pulses to travel via NAND gate 19 from the output ZC of counter stage Z2 to the forward-backward counter 10. In the present case a maximum of sixteen pulses can be counted since with the sixteenth pulse at 10E, a logic "1" will appear at output 10E so that NAND gate 19 will be blocked by inverter 22.

Once a given counter state of counter 5, and in particular, counter stage Z4, has been reached in FIG. 2, NAND gate 3 is blocked so that no further oscillations or pulses can reach counting input ZE. The blockage is effected in that the logic potential changes from "1" to "0" at the output of NAND gate 4 once a "1" is present at both its inputs, i.e., when at the outputs of counter stage Z4, A = C = "1". The predetermined counter state is thus 8000. This predetermined counter state has been selected sufficiently high so that it is longer than the maximum permissible time duration of a genuine signal of frequency $f_1$ and consequently all of the possibly desired instructions are covered by lower counter states of counter 5. The change in potential from logic "1" to "0" at the output of NAND gate 4 is also imparted, via AND gate 16, to the enabling input 17f of flip-flop 17. As a result the potential at output 17d changes from logic "1" to "0" so that the counter contents of the forward-backward counter 10 is erased by the application of a logic "1" to its clear input CE via OR gate 20. Furthermore, the output of flip-flop 17 causes flip-flop 18 to be blocked so that it can no longer be triggered.

During normal operation, NAND gate 3 is blocked upon the occurrence of oscillations or pulses at frequency $f_2$, due to $\overline{Q_2}$ = "0", before the above-mentioned predetermined counter state has been reached. Flip-flop 18 is enabled for setting by $Q_2$ = "1" at its enabling input 18f. However, it will be set only after a certain delay period. For this purpose, setting input 18e is connected with a delay circuit 24, for example, a monostable multivibrator, which is controlled at its input terminal 25, for example, at the beginning of the occurrence of oscillations at frequency $f_2$, by a logic "1" but transfers this "1" to setting input 18e only after a delay period $\tau$. Upon termination of the above-mentioned delay period all three inputs of NAND gate 18c have a "1" potential because the output 17d of flip-flop 17 is still at logic "1" since $Q_1$ = "1". Flip-flop 18 is now set and takes over the holding function of flip-flop 17 at NOR gate 20. Furthermore, output 18d releases NAND gate 21. Now pulses 9, which are obtained, for example, from a quartz oscillator, can reach the backward counting input R of forward-backward counter 10 which now counts back to zero. The counting back can be effected only to zero because at that counter state NAND gate 21 will be blocked via OR gate 23 which responds to the state of counter 10. Thus only as many pulses 9 can reach backward counting input R as have previously been obtained from the counting output ZC of counter stage Z2. Those pulses 9 passed through gate 21 are simultaneously fed in time succession to the control circuit (not shown) where they are evaluated in a known manner and produce the desired channel selection instruction.

The present invention is not limited to the described and illustrated embodiment. It can also be used, for example, for ultrasonic control of a radio receiver or other instruments whenever it is intended to eliminate the influence of interfering oscillations. The received oscillations may also be electromagnetic oscillations transmitted by wireless means.

It will be understood that the above description of the present invention is susceptible to various modifications, changes and adaptations, and the same are intended to be comprehended within the meaning and range of equivalents of the appended claims.

What is claimed is:

1. In a circuit arrangement for evaluating a received signal of a predetermined frequency, and whose maximum possible time duration is predetermined, by determining the time duration of the signal of said predetermined frequency, said circuit arrangement including a counter, means responsive to said received signal for feeding pulses of a constant frequency to the counting input of said counter to cause same to count during the time said signal of predetermined frequency is being received, and a memory means having its input connected to an output of said counter for storing a count representative of the number of counted pulses, the improvement comprising logic means, responsive to the counting state of said counter, for interrupting the feeding of said pulses to said input of said counter and for erasing the information stored in said memory whenever a counter state corresponding to said maximum permissible time duration has been exceeded due to receipt of interference signals having said predetermined frequency, whereby an erroneous evaluation is avoided.

2. A circuit arrangement as defined in claim 1 wherein said memory is a forward-backward counter.

3. A circuit arrangement as defined in claim 1 wherein the number of pulses fed to said counter is equal to the number of received oscillations of said predetermined frequency.

4. An ultrasonic remote control apparatus including a circuit arrangement as defined in claim 1 wherein the transmitted and received signal comprises two sequential ultrasonic signals at different frequencies with the first ultrasonic signal being at said predetermined frequency and having a time duration which determines the type of instruction and the second ultrasonic signal being at a different predetermined frequency and effecting the performance of the received instruction represented by said first signal.

5. An ultrasonic remote control apparatus as defined in claim 4 further comprising: means for receiving said ultrasonic signals and for converting same to said pulses; and means responsive to a pulse indicating receipt of said second ultrasonic signal for interrupting the feeding of said pulses to said counter and for causing the contents of said memory to be readout to a control circuit for carrying out the instruction.

6. A circuit arrangement as defined in claim 1 wherein said logic means includes a first logic gate connected between the output of said means for feeding and the counting input of said counter and a second logic gate whose inputs are connected to selected outputs of said counter and whose output is connected to an input of said first logic gate and to said memory means.

7. A circuit arrangement as defined in claim 6 wherein said first logic gate is responsive to an output signal from said second logic gate to interrupt the feeding of said pulses to the counting input of said counter.

8. A circuit arrangement as defined in claim 7 wherein the first logic gate is a NAND gate.

9. A circuit arrangement as defined in claim 7 wherein said second logic gate is a NAND gate which has two inputs connected to selected outputs of the counter which are associated with said counter state corresponding to said maximum predetermined time duration and whose output potential changes from logic "1" to "0" whenever said selected outputs of said counter are at logic "1".

10. A circuit arrangement as defined in claim 9 wherein said memory is a forward-backward counter and wherein the memory contents are erased whenever the potential at the output of said second logic gate changes from logic "1" to logic "0".

* * * * *